United States Patent [19]

Chen et al.

[11] Patent Number: 5,747,856
[45] Date of Patent: May 5, 1998

[54] VERTICAL CHANNEL MASKED ROM MEMORY CELL WITH EPITAXY

[75] Inventors: Ling Chen, Sunnyvale, Calif.; Sung-Mu Hsu, I-Lan; Weng Liang Fang, Hsin-chu, both of Taiwan

[73] Assignee: Taiwan Semiconductor Manufacturing Company Ltd., Hsin-Chu, Taiwan

[21] Appl. No.: 827,633

[22] Filed: Apr. 10, 1997

Related U.S. Application Data

[60] Continuation of Ser. No. 559,108, Nov. 16, 1995, which is a division of Ser. No. 332,908, Nov. 1, 1994, Pat. No. 5,510,287.

[51] Int. Cl.⁶ .......................... H01L 29/76; H01L 29/94; H01L 31/062; H01L 31/113
[52] U.S. Cl. ...................... 257/390; 257/330; 257/623
[58] Field of Search .................. 257/328, 329, 257/390, 623, 763, 764, 797; 365/186, 180, 330-4

[56] References Cited

U.S. PATENT DOCUMENTS

| | | | |
|---|---|---|---|
| 5,244,824 | 9/1993 | Sivan | 437/52 |
| 5,378,914 | 1/1995 | Ohzu et al. | 257/369 |
| 5,426,321 | 6/1995 | Hyodo | 257/329 |
| 5,637,898 | 6/1997 | Baliga | 257/330 |

FOREIGN PATENT DOCUMENTS 334328  2/1991  Japan ......................... 257/329

OTHER PUBLICATIONS

IBM Technical Disclosure Bulletin vol. 32 No. 3A, pp. 77–78, Aug. 1989.
Oya, Shuichi, MOS Type Field Effect Transistor, PTO 97–2798 (Translation of Kokai 3-3478) Jun. 29, 1989.

*Primary Examiner*—Wael Fahmy
*Assistant Examiner*—Howard Weiss
*Attorney, Agent, or Firm*—George O. Saile; Stephen B. Ackerman; Graham S. Jones, II

[57] ABSTRACT

A device and a method of manufacture of a semiconductor device on a semiconductor substrate is provided. An N+ source layer is formed on the surface of the semiconductor substrate. A dielectric layer is formed on the surface of the source layer. The dielectric layer is patterned and etched forming a dielectric layer pattern with openings therein, a silicon epitaxial layer in the openings in the dielectric layer pattern. An N+ drain layer is formed on the surface of the silicon epitaxial layer. A second dielectric layer is formed on the surface of the device including the N+ drain layer. A conductor layer is formed and patterned containing silicon over the second dielectric layer. An N+ implant mask with an N+ opening over a region of the epitaxial layer is formed (source) and ion implanting through that N+ opening into the N+ implant mask in that region. A code implant mask over the conductor layer is formed and ions are implanted through the code implant mask into the device.

26 Claims, 4 Drawing Sheets

VERTICAL CHANNEL MASKED ROM MEMORY CELL WITH EPITAXY

This application is a continuation of U.S. patent application Ser. No. 08/559,108 filed Nov. 16, 1995, which is a division of apploication U.S. patent application Ser. No. 08/332,908, filed Nov. 1, 1994, now U.S. Pat. No. 5,510,287.

BACKGROUND OF THE INVENTION

1. Field of the Invention

This invention relates to semiconductor memory devices and more particularly to vertical ROM devices.

2. Description of Related Art

U.S. Pat. No. 5,244,824 of Sivan for "Trench Capacitor and Transistor Structure and Method for Making the Same" shows a vertical channel memory cell for a DRAM.

Current flat type cells need to use a virtual ground technique to reduce effective cell size. Some problems with using such a virtual ground technique are as follows:

1) increase in chip size due to extra decoder circuits required for the virtual ground technique.

2) slower speed results from the additional delays caused by extra decoder circuits.

SUMMARY OF THE INVENTION

An object of this invention is to eliminate the need for a virtual ground technique while maintaining the same cell size as a flat cell for the same layout rule.

In accordance with another aspect of this invention, a semiconductor device on a semiconductor substrate with the following features is provided. An N+ source layer is formed on the surface of the semiconductor substrate. A pattern of silicon epitaxial regions is formed on the N+ source layer. An N+ drain layer is formed on the surface of the silicon epitaxial regions. A dielectric layer is formed on the surface of the device including the N+ drain layer. A conductor layer containing silicon overlies the dielectric layer. An N+ implant has been made into the epitaxial layer for source contact and metal interconnect as well as a code ion implant in the device.

Preferably, the conductor layer comprises a material selected from polysilicon and a polycide selected from the group consisting of $WSi_2$, $TiSi_2$, $CoSi_2$, $MoSi_2$, and $TaSi_2$.

Preferably, the double vertical channels are formed for each cell.

Preferably, the ion implanting through the code implant mask into the device employs boron.

Preferably, the code implant was performed with a dose of boron ions implanted within the range from about $1\times10^{13}$ $cm^{-2}$ to about $5\times10^{14}$ $cm^{-2}$.

Preferably, the dose was applied at from about 120 keV to about 300 keV.

Preferably, with an N+ drain layer on the surface of the silicon dielectric layer ion implanted with an N-dopant.

Preferably, with an N+ drain layer on the surface of the silicon dielectric layer formed by thermal diffusion.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a new vertical channel memory cell technology employing an epitaxial process for growing a vertical channel. The cell is especially well adapted for use as a Mask ROM and is also adapted to use in other kinds of memories and repeated arrays.

Figure 1:
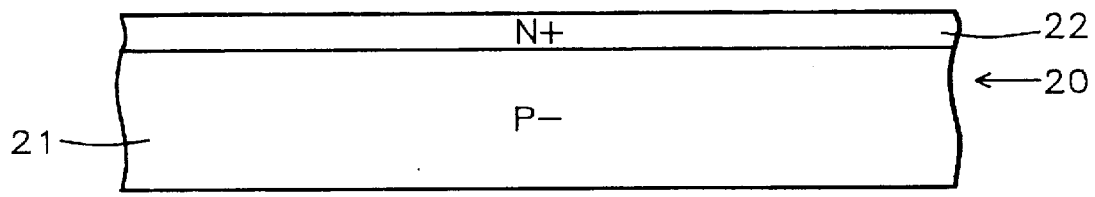
FIG. 1 shows a device in the early stages of manufacture comprising a P- silicon substrate on the surface of which an N+ source region has been formed by either one of two processes comprising thermal diffusion or ion implantation.

FIG. 1 shows a device 20 in the early stages of manufacture comprising a P- silicon substrate 21 on the surface of which an N+ source region 22 has been formed by either one of two processes comprising:

1) thermal diffusion of arsenic, antimony or phosphorous, or 2) ion implantation of arsenic, antimony or phosphorous with energy at a level from about 60 keV to about 120 keV, with a dose of $1\times10^{15}$ $cm^{-2}$ to about $8\times10^{15}$ $cm^{-2}$ and then thermal annealing.

It should be noted that substrate 21 can be an N-silicon substrate.

Figure 2:
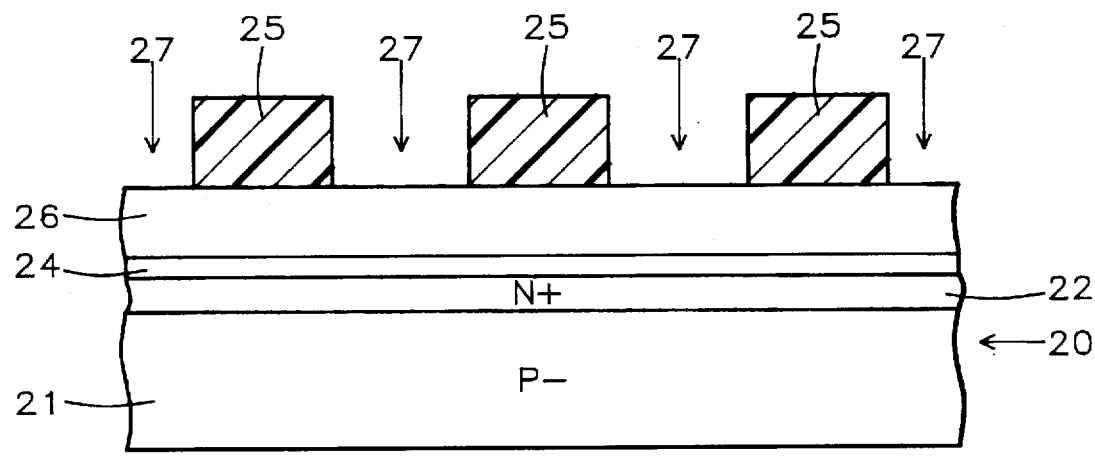
FIG. 2 shows the device of FIG. 1 with a blanket thermally grown, dielectric, silicon dioxide (thermal oxide) layer formed upon which a mask is then formed.

FIG. 2 shows the device of FIG. 1 with a blanket thermally grown, dielectric, silicon dioxide (thermal oxide) layer 24 formed having a thickness from about 100 Å to about 1000 Å by a process selected from the following:

1) dry or steam thermal oxidation at a temperature from 800° C. to 1,000° C., 2) any chemical vapor deposition (CVD) process for forming silicon dioxide, or 3) a combination of 1) or 2) above with a preference for thermal oxidation.

Next, a blanket, dielectric, silicon dioxide (oxide) layer 26 having a thickness of from about 2,000 Å to about 9,000 Å, is formed by the process as follows 1) steam thermal oxidation at a temperature from 800° C. to 1,000° C., 2) any chemical vapor deposition (CVD) process of forming silicon oxide, or 3) a combination of 1) or 2) above.

Then a blanket photoresist layer 25 is deposited. Next, photoresist layer 25 is patterned by exposure through a photolithographic drain mask and development of layer 25 forming a drain pattern having openings 27, as shown.

In the next step using openings 27 in mask layer 25, an etching process follows using plasma etching of silicon dioxide layers 24 and 26 through openings 27. The plasma dry etching process uses chemicals such as $CF_4$, $C_2F_6$, ..., etc. which are well known by those skilled in the art to etch silicon oxide.

Figure 3:
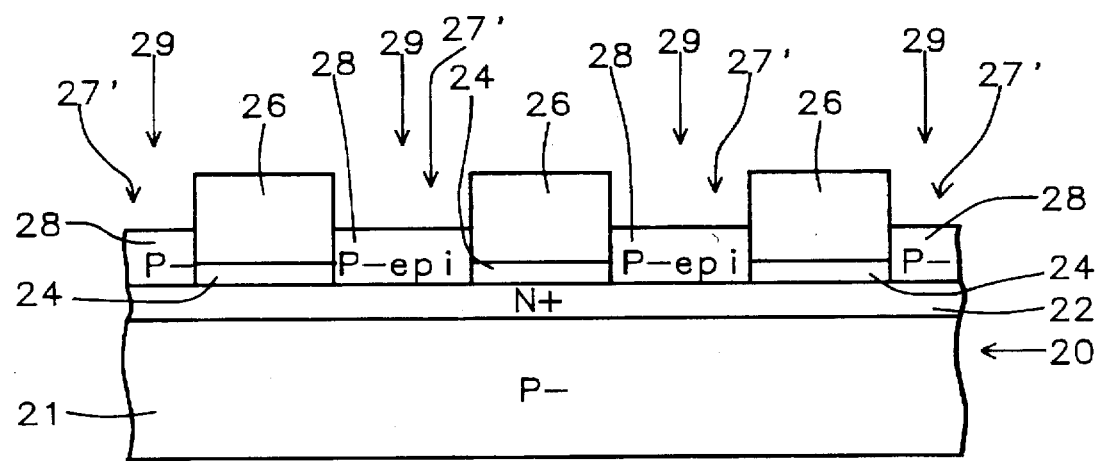
FIG. 3 shows the device of FIG. 2 after etching through openings in the mask leaving stacks of thermal "oxide" layer on the bottom and "oxide" layer on the top between which are newly grown silicon epitaxial regions.

The etching through openings 27 forms openings 27' as shown in FIG. 3. Then the mask 25 is removed from the device 20 after the etching process described above leaving stacks of thermal "oxide" layer 24 on the bottom and "oxide" layer 26 on top.

Between the stacks of thermal "oxide" layer 24 and "oxide" layer 26 are grown silicon epitaxial regions 28. The preferred process for growing regions 28 is silicon epitaxial growth with $SiH_2Cl_2$ ($H_2$ can be added) within a temperature range from 800° C. to 1,100° C. Alternatively one can use $SiH_4$, $SiHCl_3$, or $SiCl_4+H_2$ within the same temperature range.

The epitaxial silicon regions 28 are doped with a P-type dopant by ion implantation with boron ions 29 applied with a dose of about $5\times10^{11}$ cm$^{-2}$ to about $5\times10^{13}$ cm$^{-2}$ boron ions 29 are implanted at an energy of from about 50 keV to about 100 keV in a high current implanter type of tool. The epitaxial silicon regions 28 can also be doped with boron during epitaxial growth with the use of dopant gas such as $BBr_3$ or $BH_3$ to a level to about $4\times10^{16}$ cm$^{-3}$ to about $7\times10^{17}$ cm$^{-3}$, or both methods can be applied.

Figure 4:
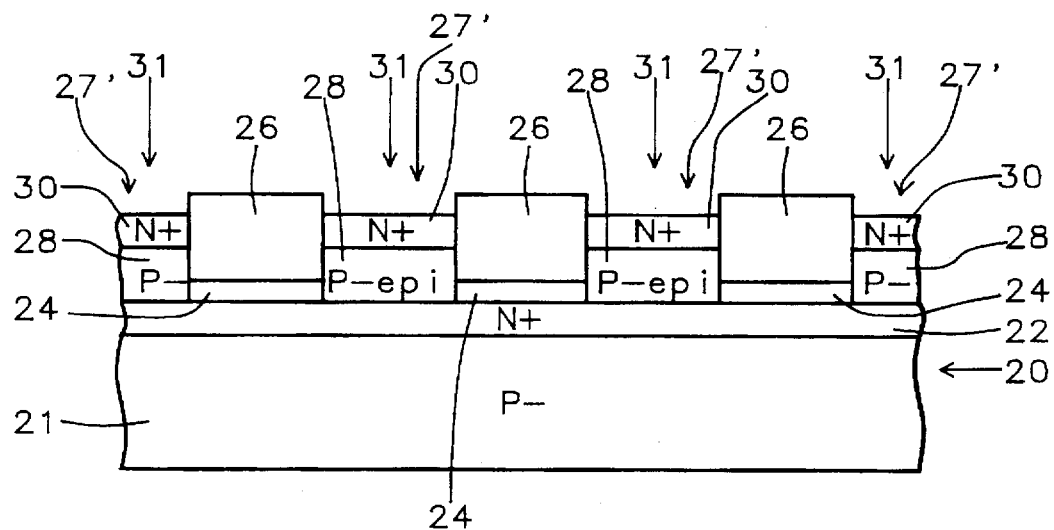
FIG. 4 shows the device of FIG. 3 subsequent to formation of N+ drains 30.

Next, as shown in FIG. 4, the device of FIG. 3 is shown subsequent to formation of N+ drains 30 drain regions 30 over epitaxial silicon regions 28 forming stacks of of the drain regions 28 and epitaxial regions 30. Drains 30 are formed by one of two preferred processes.

One process of forming drains 30 is N+ dopant implantation in which drains 30 are doped with a N+ dopant by ion implantation with N-ions 31 composed of a dopant of arsenic, antimony or phosphorous applied with a dose of from about $1\times10^{15}$ cm$^{-2}$ to about $6\times10^{15}$ cm$^{-2}$. It is implanted at an energy of from about 40 keV to about 80 keV in a high current implanter type of tool. The preferred chemical species of the dopant implanted is arsenic with a dose of from about $2\times10^{15}$ cm$^{-2}$ to about 4 E15 cm$^{-2}$, at an energy of from about 40 keV to about 60 keV.

Alternatively, the N+ drains 30 are formed by thermal deposition and diffusion of arsenic or phosphorus or antimony from gas sources of $ArH_3$, $PH_3$ or any other appropriate sources known to those skilled in the art. The sheet resistance of N+ drains 30 can be in the range from 30 ohms/square to 100 ohms/square. The N+ dopant layer will be in the range of 0.15 μm to 0.3 μm thick which is related to the vertical channel length of the ROM cell (from bottom of N+ drains 30 to the top of the N+ source region 22.)

Figure 5:
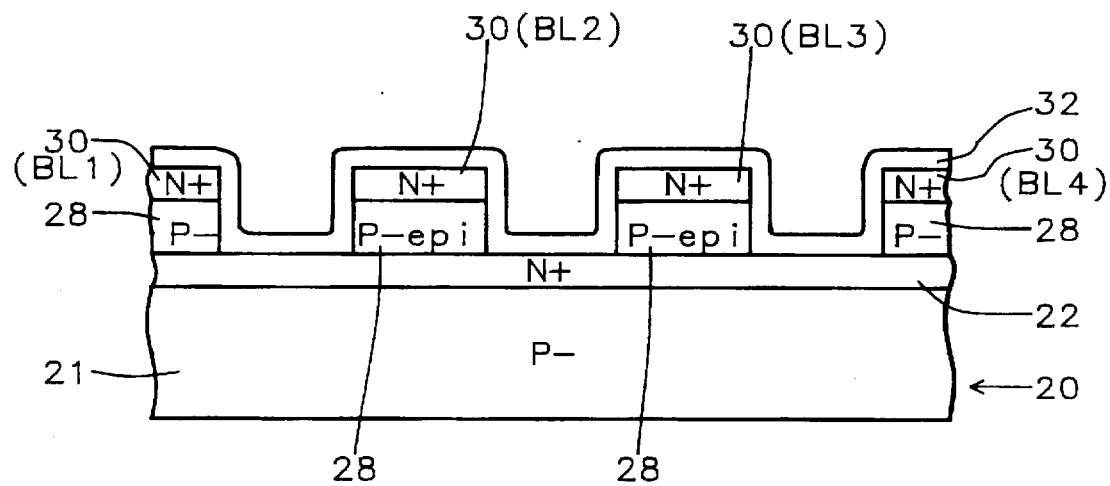
FIG. 5 shows the device of FIG. 4 subsequent to an etching step which removes the remainder of silicon dioxide layer followed by a conventional gate oxide process.

FIG. 5 shows the device of FIG. 4 subsequent to an etching step which removes the remainder of silicon dioxide layers 24 and 26 through openings 27'; which etching step is performed using BOE (buffered oxide etchant) or HF wet etching leaving the stacks of of the drain regions 30 and epitaxial regions 28. The etching away of stacks of silicon dioxide layer 24 and 26 also leaves slots between an array of stacks of drain regions 30 and epitaxial channel regions 28 and exposes the surface of N+ source region 22 at the bottom of those slots.

Next, a conventional gate oxide process is performed to form gate oxide layer 32 on the newly exposed surfaces of N+ source region 22 and over the remainer of the device as a blanket layer by the process of thermal oxidation, either dry or with steam. The gate oxide layer is a thin conformal layer which is formed on the tops of drain regions 30 and on the sidewalls of the stacks of drain regions 30 and and epitaxial regions 28 extending down between the stacks covering the surfaces of the source region 22 between the stacks.

Figure 6:
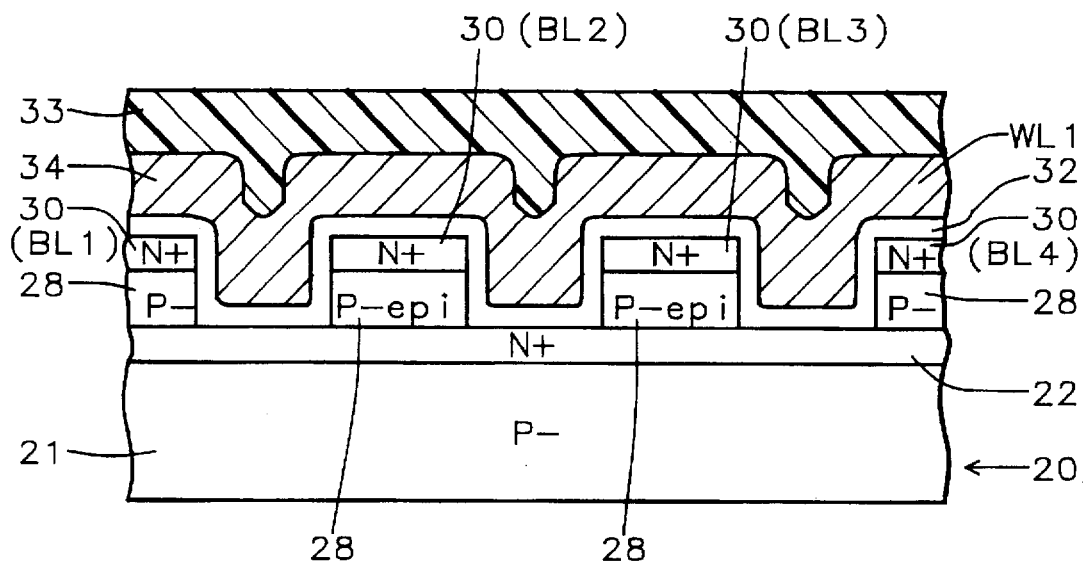
FIG. 6 shows the device of FIG. 5 after a polycide (silicon containing), word line (WL1) conductor layer 34 is deposited and patterned into word line conductors.

Then as shown in FIG. 6, a polycide (silicon containing), word line (WL1) conductor layer 34 is deposited having a thickness of from about 2,000 Å to about 4000 Å, composed of a material selected from the group of polycide materials consisting of $WSi_2$, $TiSi_2$, $CoSi_2$, $MoSi_2$, and $TaSi_2$. For example, $WSi_2$ can be formed from CVD of $WF_6$ and $SiH_4$ or $SiH_2Cl_2$. $TiSi_2$ can be formed from sputtering Ti on polysilicon and then annealed. Polysilicon can be used as a substitute or both can be used. The word line conductor layer 34 is formed on the top of conformal gate oxide layer 32 and layer 34 extends down between the stacks above surfaces the gate oxide layer 32.

The word line (WL1) conductor layer 34 is patterned to provide transverse word lines across the top of the structure in accordance with the state of the art by applying and patterning a mask 33. The mask is composed of photoresist and is patterned photolithographically by exposure and development. Then the patterned mask 33 is employed to etch away the unwanted portions of layer 34 leaving the word lines, such as word lines WL1 behind.

Contact Formation

Figure 7:
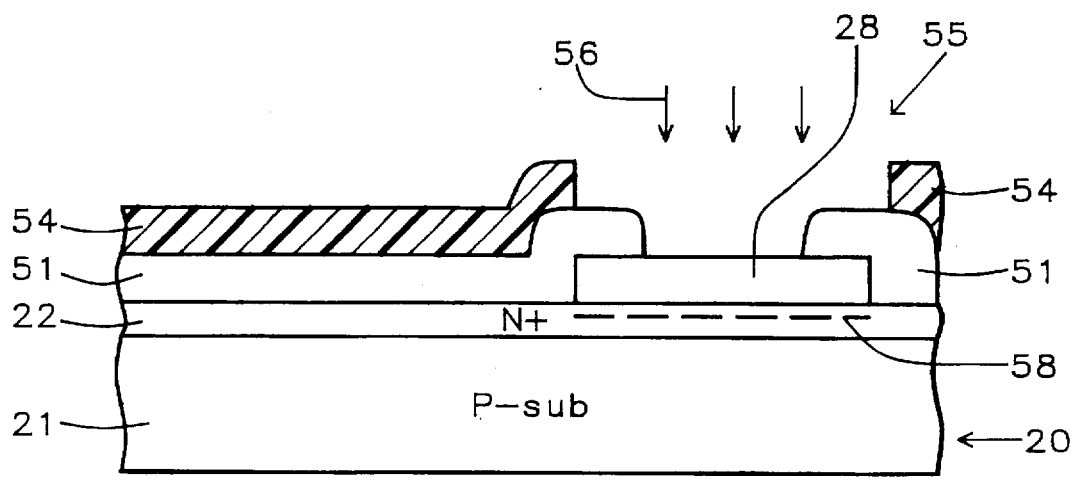
FIG. 7 shows a sectional view of the device of FIG. 6 taken through a source N+ interconnect structure where contact between metallization and the source layer is to be formed by ion implantation of a contact region of the source layer with N+ boron ions.

FIG. 7 shows the device 20 after formation of a source N+ interconnect through contact and metal, a mask 54 has been formed to define an area into which to make a contact implant 58 into N+ common source region 22 area. The N+ implanted region 58 is adapted for connecting interconnect metallization to N+ common source region 22. An ILD layer 51 is patterned photolithographically to form a contact implant mask 54 with opening 55 for making the implant into channel 22 below the P-epi region 28 which is the source region area of a ROM cell. To form photomask 54 to pattern ILD layer 51, the device 20 is covered with photoresist 54 over interlayer dielectric (ILD) layer 51, which has been formed over this region of the device 20. There is an opening 55 through ILD layer 51 down to P-epi region 28. The ILD layer 51 is preferably composed of BPSG.

Next, as indicated above, the N+ source region 22 is doped by ion implantation with N+ phosphorus or arsenic ions 56 applied with a dose of from about $1\times10^{15}$ cm$^{-2}$ to about $6\times10^{15}$ cm$^{-2}$. The ions 56 are implanted at an energy of from about 180 keV to about 300 keV in a high current implanter type of tool. The preferred chemical species of the dopant implanted is phosphorus ions 56 applied with a dose of from about $1\times10^{15}$ cm$^{-2}$ to about $6\times10^{15}$ cm$^{-2}$ implanted at an energy of from about 180 keV to about 300 keV.

Later a contact is opened above implanted region 58 for forming the metal interconnection. Neither do the mask 54 and N+ implanted areas need to be very large nor do many areas need to be implanted if effective source N+ resistance is small enough. Thus die size is saved. Also, this mask and implant should happen before formation of the code mask and code implanting.

Code Implanting

Figure 8:
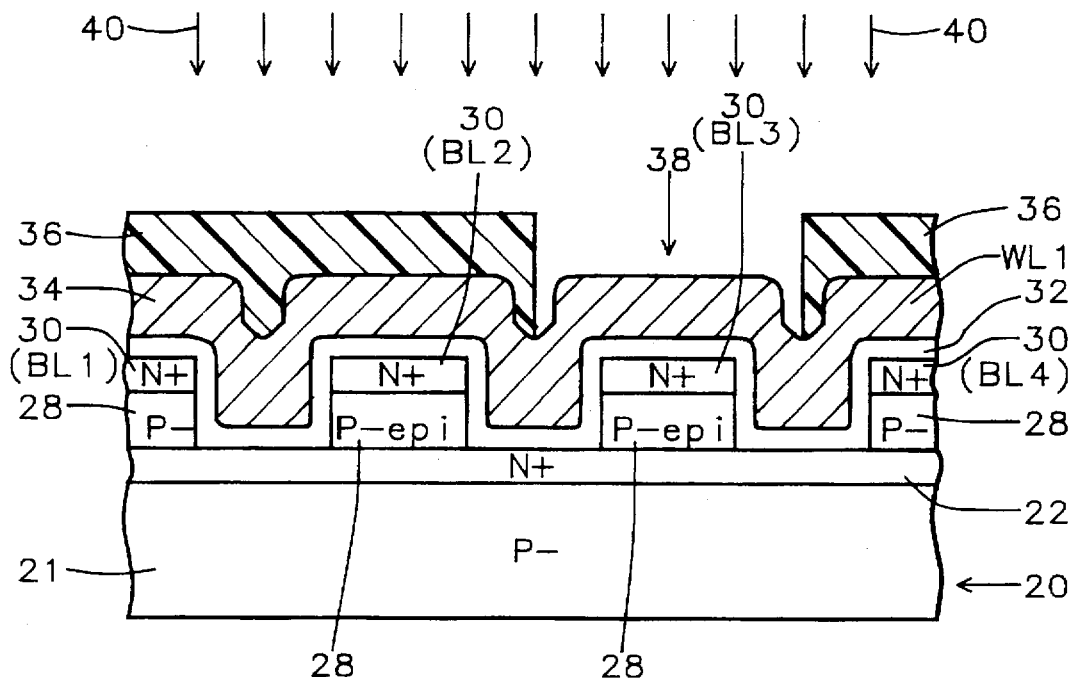
FIG. 8 shows the device of FIG. 6 covered with a photoresisi mask to form a source P-epi code implant mask for making a code implant into channels below and onto the P-epi region which is the channel area of a ROM cell.

Then, as shown in FIG. 8, the device of FIG. 6 is covered with photoresist layer 36 which is patterned photolithographically to form a source P-epi code implant mask 36 with a code implant opening 38 for making a code implant into the P-epi region 28 which is the channel area of a ROM cell. Below N+ regions 30 and P-epi region 28 is N+ doped source region 22. Regions 30 are portions of bit lines BL1, BL2, BL3 and BL4 as indicated in parentheses in FIGS. 5–8.

The P-epi region 28 is doped by ion implantation with N+ ions 40 composed of a dopant of boron applied with a dose from about $1\times10^{13}$ cm$^{-2}$ to about $5\times10^{14}$ cm$^{-2}$. It is implanted at an energy of from about 100 keV to about 200 keV in a high current implanter type of tool.

Figure 9:
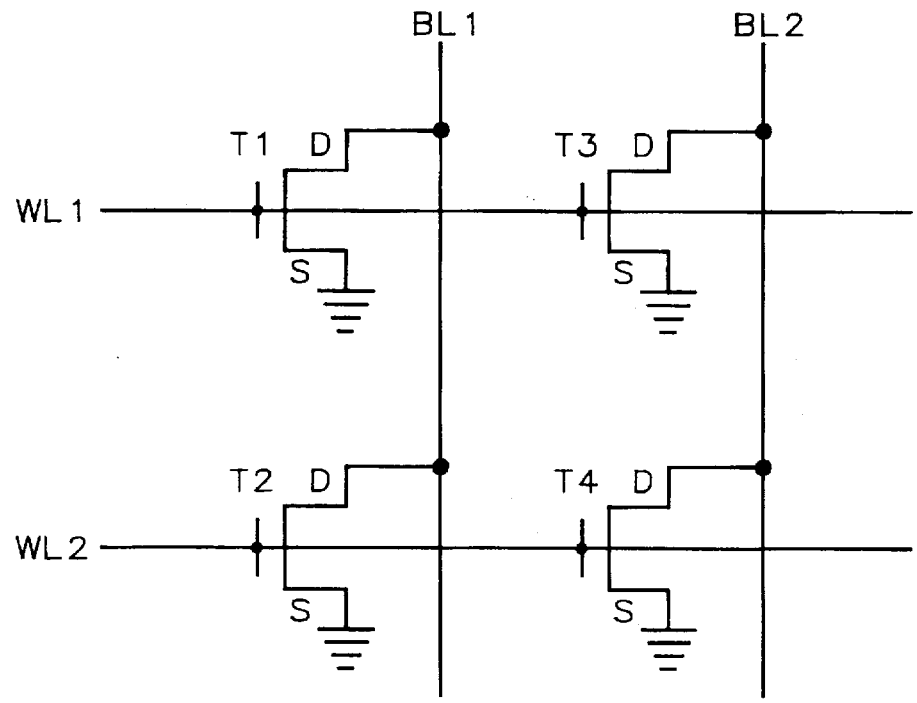
FIG. 9 shows an electrical schematic diagram of a device in accordance with this invention.

FIG. 9 shows an electrical schematic diagram of a ROM array in accordance with this invention including four FET transistors. Two of those FET transistors T1 and T3 have their gates connected to word line WL1. The other two FET transistors T2 and T4 have their gates connected to word line WL2. The transistors T1 and T2 have their drains connected to bit line BL1; and transistors T3 and T4 have their drains connected to bit line BL2. Transistors T1, T2, T3 and T4 have their sources connected together in a common reference potential. Drain region D (drain 30 in FIG. 8) of transistor T1 in FIG. 9 is a portion/part of bit line BL1 and drain region D (drain 30 in FIG. 8) of transistor T3 is a portion/part bit line BL2. The FET transistors T1 and T3 have common sources in the common source region 22 described above.

Summary

Advantages of this invention include as follows:

1) Double channels are provided for each cell.
2) There are common sources so there is as follows:
  a) No need of a virtual ground technique.
  b) No need of decoding source lines.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device formed on a doped semiconductor substrate having a surface on which common source FET devices are formed comprising:

said semiconductor device including a source region layer on said surface of said semiconductor substrate, a pattern of spaced apart, doped silicon epitaxial regions on said source region layer, a plurality of drain regions formed on the top surface of each of said silicon epitaxial regions, said drain regions comprising portions of bit lines, said epitaxial regions and said drain regions forming stacks on said source region layer leaving exposed surfaces of said source region layer between said stacks, a conformal gate oxide layer formed covering exposed surfaces of said device including top surfaces and sidewalls of said drain regions comprising bit lines, the sidewalls of said epitaxial regions and said exposed surfaces of said source region layer between said stacks, said gate oxide layer extending conformally down along the sidewalls of said stacks, a transverse word line conductor layer containing silicon over said conformal gate oxide layer, said transverse word line conductor layer extending across said stacks, an implant region in a said epitaxial region for source contact and metal interconnect, said drain regions, said source region layer and said epitaxial regions forming a plurality of FET transistors in said device, and a code ion implant region in said device.

2. The device of claim 1 wherein said conductor layer comprises a material selected from the group consisting of polysilicon and a polycide, said polycide being composed of a material selected from the group consisting of $WSi_2$, $TiSi_2$, $CoSi_2$, $MoSi_2$, and $TaSi_2$.

3. The device of claim 1 wherein double vertical channels are formed for each cell.

4. The device of claim 1 wherein said code ion implant comprises boron.

5. The device of claim 4 wherein said code implant was doped with boron ions within the range from about $1\times10^{13}$ cm$^{-2}$ to about $5\times10^{14}$ cm$^{-2}$.

6. The device of claim 1 with said drain regions on the surface of said silicon epitaxial layer doped with an N-dopant.

7. A semiconductor device formed on a P-semiconductor substrate having a surface on which common source FET devices are formed comprising:

said semiconductor device including an N+ source region layer on said surface of said semiconductor substrate, a pattern of spaced apart, P-doped silicon epitaxial regions formed on the top surface of said source layer, said patterned silicon P-doped epitaxial regions being doped with boron from about $4\times10^{16}$ cm$^{-3}$ to about $7\times10^{17}$ cm$^{-3}$, N+ doped drain regions having a thickness from about 0.15 μm to about 0.3 μm formed on the top surface of each of said silicon epitaxial regions, said drain regions being portions of bit lines, and said drain regions having a sheet resistance in the range from about 30 ohms/square to about 100 ohms/square, said P-doped epitaxial regions and said N+ drain regions forming stacks on said N+ source region leaving exposed surfaces of said N+ source region between said stacks, a conformal gate oxide layer formed covering exposed surfaces of said device including top surfaces and sidewalls of said N+ drain regions, the sidewalls of said P-doped epitaxial regions and said exposed surfaces of said N+ source region between said stacks, said gate oxide layer extending conformally down along the sidewalls of said stacks, a transverse word line conductor layer containing silicon formed over said conformal gate oxide layer and extending across said stacks, and conformally on said sidewalls of said stacks on the surface of said gate oxide layer, an N+ implant into said source region for source contact and metal interconnect, said drain regions, said source region layer and said epitaxial regions forming a plurality of FET transistors in said device, and an N+ code ion implant region into one of said P-doped epitaxial vertical channel regions of said device.

8. The device of claim 7 wherein:

said conductor layer comprises a material selected from the group consisting of polysilicon and a polycide, said polycide being composed of a material selected from the group consisting of $WSi_2$, $TiSi_2$, $CoSi_2$, $MoSi_2$, and $TaSi_2$.

9. The device of claim 7 wherein:

double vertical channels are formed for each cell in said device.

10. The device of claim 7 wherein:

said code ion implant region dopant comprises boron.

11. The device of claim 7 wherein:

said code ion implant comprises boron formed from with boron dopant ions within the range from about $1\times10^{13}$ $cm^{-2}$ to about $5\times10^{14}$ $cm^{-2}$.

12. The device of claim 7 wherein:

said code implant comprises boron formed with boron ions within the range from about $1\times10^{13}$ $cm^{-2}$ to about $5\times10^{14}$ $cm^{-2}$, said boron ions having been applied at an energy from about 100 keV to about 200 keV.

13. The device of claim 7 wherein:

said code implant comprises boron formed with boron ions within the range from about $1\times10^{13}$ $cm^{-2}$ to about $5\times10^{14}$ $cm^{-2}$, said boron ions having been applied at an energy from about 100 keV to about 200 kev, and said N+ drain layer on the surface of said silicon epitaxial regions doped with an N- dopant.

14. The device of claim 7 wherein said code implant said code ion implant comprises boron which was formed from boron ions within the range from about $1\times10^{13}$ $cm^{-2}$ to about $5\times10^{14}$ $cm^{-2}$ said boron ions having been applied at an energy from about 100 keV to about 200 keV with said N+ drain layer on the surface of said silicon epitaxial regions diffused with material selected from the group consisting of arsenic, phosphorus and antimony.

15. A semiconductor device formed on a P-semiconductor substrate having a surface on which common source FET devices are formed comprising:

said semiconductor device including an N+ source region layer on said surface of said semiconductor substrate, a row of stacks formed on said upper surface of said source region layer, with one of said spaces being located between each adjacent pair of said stacks and above said upper surface of said source region layer, a pattern of spaced apart, P-doped silicon epitaxial regions formed on the top surface of said N+ source region layer, said patterned P-doped silicon epitaxial, vertical channel regions doped with a concentration of boron from about $4\times10^{16}$ $cm^{-3}$ to about $7\times10^{17}$ $cm^{-3}$, a plurality of N+ drain regions comprising portions of bit lines, said drain regions having a thickness from about 0.15 μm and about 0.3 μm, one of said drain regions being formed on the top surface of each of said P-doped silicon epitaxial, channel regions, said N+ drain regions having a sheet resistance in the range from about 30 ohms/square to about 100 ohms/square, said P-doped silicon epitaxial, channel regions and said N+ drain regions forming said stacks on said N+ source region layers leaving exposed surfaces of said N+ source region layers between said stacks, a conformal gate oxide layer formed covering exposed surfaces of said device including top surfaces and sidewalls of said N+ drain regions, the sidewalls of said P- doped silicon epitaxial regions and said exposed surfaces of said N+ source region layer between said stacks, said gate oxide layer extending conformally down along the sidewalls of said stacks, a transverse word line conductor layer composed of a material selected from the group of materials consisting of polysilicon and a polycide, said polycide being selected from the group consisting of $WSi_2$, $TiSi_2$, $CoSi_2$, $MoSi_2$, and $TaSi_2$, said conductor layer having a thickness from about 2,000 Å and about 4,000 Å formed over said conformal gate oxide layer and said transverse word line conductor layer extending across said stacks, an N+ dopant region implant in said source region for source contact and metal interconnect, said drain regions, said source region layer and said epitaxial regions forming a plurality of FET transistors in said device, and an N doped code ion implant region in a selected one of said P- doped silicon epitaxial channel regions of said device forming double vertical channels for each cell in said device.

16. The device of claim 15 wherein:

said code implant was doped with a dose of boron ions within the range from about $1\times10^{13}$ $cm^{-2}$ to about $5\times10^{14}$ $cm^{-2}$, and said N+ drain layer on the surface of said silicon epitaxial regions comprising the product of thermal deposition and diffusion of material selected from the group consisting of arsenic, phosphorus and antimony.

17. The device of claim 7 wherein:

said common sources for said FET transistors are formed from said N+ source region layer on said surface of said semiconductor substrate.

18. The device of claim 15 wherein:

said common sources for said FET transistors are formed from said N+ source region layer on said surface of said semiconductor substrate.

19. A semiconductor device formed on a doped semiconductor substrate having a surface on which common source FET devices are formed comprising:

said semiconductor device including a source region layer on said surface of said semiconductor substrate, said source region layer being doped with a first type of dopant and having an upper surface, a plurality of silicon epitaxial vertical channel regions doped with an opposite type of dopant from said first type of dopant, a plurality of drain regions doped with said first type of dopant comprising a portion of a bit line, a code ion implant region into one of said silicon epitaxial vertical channel regions of said device doped with the said first type of dopant and thus doped oppositely from the remainder of said silicon epitaxial vertical channel regions, a row of stacks separated by slots formed on said upper surface of said source region layer, with one of said slots being located between each adjacent pair of said stacks and above said upper surface of said source region layer, said stacks having tops and sidewalls, a conformal gate oxide layer covering said tops and said sidewalls of said stacks and covering exposed portions of said upper surface of said source region layer between said stacks and below each of said slots, each of said stacks comprising one of said doped silicon epitaxial vertical channel regions formed on said source region layer with one of said doped drain regions formed over said channel region, a transverse word line conductor layer containing silicon formed over said conformal gate oxide layer, said transverse word line conductor layer extending across said stacks down into said slots and across said previously exposed surfaces of said source region layer, an implant region in a said epitaxial region for source contact and metal interconnect, said drain regions, said source region layer and said epitaxial regions forming a plurality of FET transistors in said device.

20. The device of claim 19 wherein said conductor layer comprises a material selected from the group consisting of polysilicon and a polycide, said polycide being composed of a silicide material selected from the group consisting of $WSi_2$, $TiSi_2$, $CoSi_2$, $MoSi_2$, and $TaSi_2$.

21. The device of claim 19 wherein double vertical channels are formed for each cell.

22. The device of claim 19 wherein said code ion implant comprises boron.

23. The device of claim 19 wherein said code ion implant comprises boron said code implant was doped with boron ions within the range from about $1\times10^{13}$ cm$^{-2}$ to about $5\times10^{14}$ cm$^{-2}$.

24. The device of claim 19 wherein said code ion implant region is doped with boron with a dose of boron ions within the range from about $1\times10^{13}$ cm$^{-2}$ to about $5\times10^{14}$ cm$^{-2}$, which was applied with an energy from about 100 keV to about 200 keV, with said drain regions on the surface of said silicon epitaxial layer doped with an N- dopant.

25. The device of claim 19 wherein said code ion implant region is doped with boron with a dose of boron ions within the range from about $1\times10^{13}$ cm$^{-2}$ to about $5\times10^{14}$ cm$^{-2}$, which was applied with an energy from about 100 keV to about 200 keV, with said drain regions on the surface of said silicon epitaxial layer diffused with material selected from the group consisting of arsenic, phosphorus and antimony.

26. The device of claim 19 with said drain regions on the surface of said silicon epitaxial layer doped with an N- dopant.

* * * * *